United States Patent
Bergmann

(10) Patent No.: US 6,617,851 B1
(45) Date of Patent: Sep. 9, 2003

(54) PROBE HEAD FOR AN NMR SPECTROMETER

(76) Inventor: Wilfried Bergmann, Dürenbacher Str. 31, D-56651 Niederdürenbach-Hain (DE)

( * ) Notice: Subject to any disclaimer, the term of this patent is extended or adjusted under 35 U.S.C. 154(b) by 0 days.

(21) Appl. No.: 09/806,441
(22) PCT Filed: Sep. 30, 1999
(86) PCT No.: PCT/DE99/03148
§ 371 (c)(1), (2), (4) Date: Oct. 31, 2001
(87) PCT Pub. No.: WO00/19228
PCT Pub. Date: Apr. 6, 2000

(30) Foreign Application Priority Data

Sep. 30, 1998  (DE) .......................... 198 44 895

(51) Int. Cl.[7] .............................. G01V 3/00
(52) U.S. Cl. ...................... 324/318; 324/309
(58) Field of Search .............. 324/309, 307, 324/318, 319, 320, 322, 313, 314

(56) References Cited

U.S. PATENT DOCUMENTS

| 3,769,618 A | * | 10/1973 | Freedman et al. | ....... 333/84 M |
| 4,602,213 A | * | 7/1986 | Sugiura | ....................... 324/318 |
| 5,258,710 A | * | 11/1993 | Black et al. | ................ 324/309 |
| 5,751,146 A | | 5/1998 | Hrovat | |
| 5,814,992 A | * | 9/1998 | Busse-Grawitz et al. | ... 324/309 |

* cited by examiner

Primary Examiner—Edward Lefkowitz
Assistant Examiner—Brij B. Shrivastav
(74) Attorney, Agent, or Firm—Banner & Witcoff, Ltd.

(57) ABSTRACT

A probe head for an NMR spectrometer that provides enhanced signal to noise ratio in NMR measurements. The probe head uses at least a first waveguide to irradiate an NMR sample with an excitation wave and to conduct the emitted sample signal to the preamplifier and subsequent electronic signal processing equipment. The electrical conducting elements of the waveguide are constructed and operated under conditions such that the conductors operate in the regime defined by the anomalous skin effect and preferably in the regime defined by the extreme anomalous skin effect. The reduction in electrical resistance afforded by such construction and operation enables a reduction signal-to-noise ratio in the NMR signal detected by the probe. The invention includes in the preliminary detection circuit means for temporarily matching it with its characteristic impedance.

27 Claims, 5 Drawing Sheets

PROBE HEAD FOR AN NMR SPECTROMETER

This invention relates to a probe head for a NMR-spectrometer comprising at least one transmitter unit for generating electromagnetic waves of high frequencies and at least one preamplifier unit for amplification of signals emanating from a sample which has been excited by means of the excitation waves, with a cryogenically cooled primary detection circuit, including at least a first antenna and a first waveguide, whereby said first antenna is connected to said preamplifier unit via said first waveguide.

The object of a NMR-experiment is to observe the electromagnetic radiation being produced by energy transitions of electrons and/or atoms in a sample irradiated by a high frequency field $B_1$ of frequency $\omega_0$ in a time and space homogeneous magnetic field $B_0$. The frequency $\omega_0$ of the excitation field $B_1$ is preferably situated within or above the hf-range at or near about 300 MHz to 3 GHz. This electromagnetic radiation is being observed against the general background of electromagnetic noise associated with thermal fluctuations in the primary detection circuit and within the sample or in the environment, too.

One particular problem common to most NMR experiments is the faintness of the signals emanating from the sample being sometimes further attenuated by a reaction in progress or by some parts of the sample absorbing from the signal. In this respect it is continuously being attempted to improve the sensitivity of the probe head and the signal-to-noise ratio.

The field strength of the constant homogeneous magnetic field $B_0$ and the frequency $\omega_0$ of its concomitant rf field $B_1$ have to be increased to their limits to maximize the signal-to-noise ratio. Simultaneously, as good as possiblke up to superconducting materials are being used in the primary detection circuit at as low as possible temperatures to minimize conduction losses and inherent electromagnetic noise. In addition the primary detection circuit has to be shielded well-proportioned from external noises.

A probe head of the above mentioned kind is known from U.S. Pat. No. 5,258,710. It comprises a first and a second resonator coupled with it, whereby said second resonator is coupled to a transmitter unit and said first resonator encloses the sample. A radio frequency signal is coupled for excitation of the sample through said second resonator to said first resonator and irradiates the sample being enclosed by said first resonator. Thereafter said first resonator acts like a receiving coil transmitting the received signals to said second resonator. The probe head is being cooled cryogenically on the one hand for improving the signal-to-noise ratio by reducing the thermal noise and on the other hand the conductivity of the probe head is increased by the utilization of superconducting materials for improving the strength of the signal.

Furthermore it is known from U.S. Pat. No. 5,751,146 a surface coil being open at one side fabricated of highly conductive material for NMR experiments, whose conductors are at least three to five times as thick as the skin depth. Thus, its high-frequency resistance is not influenced by the dimensions of the conductors.

Although already much effort was made to enhance the signal-to-noise ratio significantly, so far no NMR-spectrometers became known which achieved a gratifying signal-to-noise ratio, in particular from samples emitting negligible signal radiation.

It is therefore an object of the present invention to provide a probe head as described at the beginning with an optimized efficiency of its antennas and preamplifier unit and with a significantly improved signal-to-noise ratio.

This object is being achieved on the one hand by that at least said first waveguide operates in the range of the anomalous skin effect, whereby the mean free path of the charge carriers at least in said first waveguide being larger than the electromagnetic skin-depth, and whereby said primary detection circuit is provided with means for temporarily matching it with its own characteristic impedance.

The anomalous skin effect with its characteristic skin depth $\delta_{eff}$, ensues if the mean free path of the charge carriers l is becoming larger than the electromagnetic skin depth $\delta_{em}$ of the electromagnetic field, $l > \delta_{em}$. Conduction electrons may achieve in particular at low temperatures a mean free path in the range of millimeters to centimeters. Under these circumstances an essentially dissipation free wave propagation becomes feasible regarding the material of the waveguide. Therefore the signal received by the antenna may reach the preamplifier unit with out significant reduction for further processing.

In order that such a waveguide with an extreme low resistance attenuation and extreme high quality factor operating as resonator may be charged with a wave in as short as possible time it has to be matched temporarily with its own characteristic impedance. The analogous has to be performed if the energy of the excitation wave has to be dissipated after termination of the excitation of the sample for initiation of signal receiving. For this e.g. the antenna may be transformed into its characteristic impedance by adding in parallel an impedance via a pin-diode.

The particular advantage of such waveguides operating in the range of the anomalous skin effect in comparison with superconducting ones is in particular due to the first having no problems with fluxoids/fluxquanta.

The utilization of waveguide materials, permitting wave propagation at the anomalous skin effect, is equally advantageous for said first as for any further feasible antennas.

Preferably at least said first waveguide should operate under condition of the extreme anomalous skin effect for minimization of the dissipation.

In this correlation metallic conductors with an inherent resistivity ratio of $r_i \gg \approx 10^3$, preferably of $r_i \gg \approx 10^4$ have proven particularly qualified. The inherent resistivity ratio $r_i = \rho RT/\rho LT$ is defined as the ratio of the inherent resistivity of the conductor material at room temperature to the one at low temperatures, preferably at temperatures $\leq 20$ K, usually at 4,2K.

Furthermore, the inherent resistivity of the materials should depend as little as possible on the surrounding applied magnetic field, therefore $$\Delta\rho/\rho = (\rho(r_i,T,B \neq 0) - \rho(r_i,T,B=0))/\rho(r_i,T,B=0)$$

(with $\rho$ the inherent resistivity depending on $r_i$, T the absolute Temperature and B the applied magnetic field) should be as small as possible, in particular $\Delta\rho/\rho < \approx \leq 5$ should not be considerably exceeded at $T \leq 20$ K and at an inherent resistivity ratio of $r_i \geq 10^3$.

Ultra pure aluminum has proven to be a particularly qualified metal. Aluminum is preferred with a purity of >99.9999% (6N-aluminum) with very low defect concentration.

However, on principle aluminum with a purity of $\approx 99.9\%$ is still usable as material for conductors. However it is to be regarded that the surface-resistance $R_s$ of the conductors changes by orders of magnitude on transition from the anomalous to the electromagnetic skin effect.

Also it is of particular advantage if at least the internal and the external conductor surfaces of the first waveguide possess the same inherent conductivity as the interior of the conductor.

On principle this is valid for the entire primary detection circuit. To this aim the conductor material has to be relaxed completely by annealing and/or ageing, and the surfaces of the conductors for instance will be electro polished in order to remove completely the surface layer which was cold worked during fabrication of the waveguides. In addition the conductor surfaces can be passivated.

By these means a surface resistance in the range of $10^{-7}$ Ω or better can be achieved at operating conditions of T<4 K and at a magnetic induction of 11,744 T, just as in particular in ultra pure aluminum a resistivity ratio $r_i$ in the range of $10^5$.

In another preferred embodiment said preamplifier unit and said first antenna are switchably interconnected. If during the term of the excitement of the sample this interconnection is interrupted it is ensured that the preamplifier unit will not receive any excitement waves that are received by the antenna. Thus, it is provided for that the signals of the excitement wave which are much stronger than the signals emanating from the sample will not influence the preamplifier unit's processing of the signals to be measured.

Further, another constructive embodiment is possible which provides for the direction of propagation of the excitement wave being orientated orthogonal to the direction of propagation of the signals to be measured. In this case, it is possible that the preamplifier unit will not receive any signals of the excitement waves during the term of excitement even without interrupting the connection between the antenna and the preamplifier unit.

Helium-II has demonstrated itself to be preferred cryogen. Helium-II is regarded liquid helium below the λ-line. Among others helium-II by contrast with helium-I shows no inclination for boiling because of its superfluid and heat-superconducting properties. Noise caused by boiling can be avoided at all by using helium-II as cryogen, therefore reducing the total noise level. Thus, a critical heat-gradient of $4.3 \cdot 10^{-4}$ K/m can cause a critical heat flux of $6 \cdot 10^4$ W/m$^2$ in helium-II. these numbers indicate an effective heat conductivity about $3.5 \cdot 10^5$ times that of copper at room temperature.

The operating temperature of this probe head preferably is at about 1.85 K, at which helium-II achieves its maximum in heat-flux.

Helium-II can be used also for a dielectric medium in the first waveguide as well as in all other waveguides and/or the antennas, as its properties with a dielectric constant of $\in_r \approx 1,055$ and an inherent resistivity of $\rho_{el} < 10^{13}$ Ωm resemble closely those of vacuum. Thus helium-II can be used bilateral as cryogen and as dielectricum. Nevertheless the use of vacuum for a dielectric medium is not excluded.

Also it is advantageous, if the antenna in the NMR spectrometer is positioned below said first waveguide. Thus, at start-up operations of the spectrometer during cooling-down of the primary detection circuit to operating temperatures helium gas can depart freely upwards towards the cryostat/cryogenerator and no helium bubbles remain within the antenna nor anywhere.

The object of the invention is further achieved for a probe head as described in the beginning by a second wave guide that is coupled in particular via at least one aperture to said first wave guide, said second wave guide being connected with said transmitter unit, and means being provided for coupling the excitation wave from said second waveguide to said first wave guide, by which means the propagation of the excitation wave is suppressed in direction to said preamplifier unit.

Consequently, excitation waves are being coupled into said first waveguide in the direction of the antenna, thus an antenna of the particular design has not only the function of receiving signals from the sample but also has to generate the $B_1$-field for the excitation of the sample.

The particular means for coupling the excitation waves from the second waveguide to the first waveguide ensure, that the preamplifier unit is not being perturbed by the excitation wave which is of much higher intensity in comparison with the signal, thus the preamplifier unit becomes as soon as possible ready to receive the signal after termination of the excitation wave.

By this means it becomes feasible, that the preamplifier unit being calibrated only for reception of very weak high frequency signals will not be perturbed by the high power excitation wave and that this perturbation does not continue into the detection time after elapse of the excitation of the sample. Therefore the dead-time for receiving signals without perturbation becomes very short, thereby the preamplifier unit is becoming ready for receiving in as short a time as possible respectively immediately operative.

Different possibilities exist for cutting off the propagation of the excitation wave into the direction of the preamplifier unit.

The means for coupling in the excitation wave may enclose a λ/2-detour waveguide operating like a directional coupler.

In this embodiment the excitation wave, which is to be coupled from the second waveguide into the first waveguide is being divided, whereby both partial waves enter separated, in particular by an odd multiple of quarter wavelength $(2n+1) \cdot \lambda/4$ (n=0,1,2 . . . ) into the first waveguide, such that they are in phase in the direction of the antenna while they are out of phase by λ/2 in the direction of the preamplifier unit. By this means the first partial will be conducted as excitation wave towards the antenna for excitation of the sample with appropriate transformation and impedance matching and the wave reflected from there will be annihilated by destructive interference with the second partial wave in the direction towards the preamplifier unit.

Another possibility exists by means of short circuiting the first waveguide between the area where the second waveguide couples into the first waveguide and the preamplifier unit, in particular by at least one pin-diode.

Most appropriately, the short circuit is caused in an area of the first waveguide where the standing wave produces a voltage-node, as the oscillating currents produce there a maximum and consequently the propagation of the excitation wave in the first waveguide in the direction towards the preamplifier unit can be stopped effectively.

In another preferred embodiment of this realization the coupling of the excitation wave from the second waveguide into the first waveguide is switchable. By this means the transmitter unit can be isolated from the first detection circuit at any time.

An appropriate switch can be provided by the second waveguide being terminated as an open-circuited line or cavity resonator, which can be short-circuited temporarily by a discharge gap positioned at a distance of n·λ/2 from an aperture in the second waveguide on the opposite side to the transmitter unit for coupling into the first waveguide.

The discharge gap can be positioned moreover at the open termination of the second waveguide between the conducting surfaces, in such a way that the termination can be short-circuited by a helium plasma or arc discharge directly at the discharge gap.

However the conducting surfaces of the second waveguides can be short-circuited at their termination also, whereby one of the conducting surfaces is interrupted by the discharge gap directly in front of its short-circuited termination. Furthermore the discharge gap is dimensioned such, that the termination end of the second waveguide is open-circuited if the discharge gap is "open".

That switch depends on the reciprocal interaction of the open—respectively the short-circuited—termination of the second waveguide with an aperture $\lambda/2$ distant from it for coupling the excitation wave into the first waveguide. A wave propagated into the second waveguide will be reflected at its short-circuited termination, thus generating a standing wave. A voltage node results in the area of the aperture with an oscillating maximum (anti-node) of the magnetic field, able to couple into the first waveguide. If the short-circuited termination is transformed into an open-circuited one, then the wave propagated in the second waveguide will now be reflected at the open termination, therefore the standing wave is shifted by a quarter of a wavelength, $\lambda/4$. Thus, a voltage anti-node results in the area of the aperture of the second waveguide, generating a large amount of isolation.

To avoid unnecessary noise, no control currents for switches are permitted during transmission times of signals. It is therefore advantageous, if no particular control currents are needed for the actuation of the switch for the modification of the phase of the standing wave. The preferred switch will be actuated in case of the helium plasma discharge by a laser, in case of the arc discharge by the excitation wave itself.

At a preferred embodiment of this switch at least one electrode of the discharge gap is refrigerated by helium-II, whereby this electrode makes contact with a channel having at least one inlet and one outlet for helium-II, and whereby the outlet is equipped with a semipermeable diaphragm. As the superfluid helium-II moves in the shortest possible time towards a heat source, the heat will be carried off during its dissipation due to the helium-II flow being directed by the diaphragm.

At another preferred embodiment of this switch the second waveguide branches out into two conducting paths, which couple to the first waveguide preferably $(2n+1)\cdot\lambda/4$ distant from each other, whereby each of the two conducting paths (13", 14") end in a termination which can be shortened by $(2n+1)\cdot\lambda/4$ by a switchable short circuit.

At a particular embodiment of this switching design both of the conducting paths have at their termination short-circuited length of $(2n+1)\cdot\lambda/4$ in length, whose entrance in particular can be short-circuited with at least one pin-diode (positive intrinsic negative).

Whereas the excitation wave is being coupled into the first waveguide due to a short-circuit by the pin-diodes at the entrance of the cavities generating these voltage-node, this node will be displaced by $\lambda/4$, if the pin-diodes open the cavities, in such a way that the excitation wave is not anymore able to couple into the first waveguide.

Both conductor paths can be arranged such, that one of them produces in reference to the other one a $\lambda/2$-detour and both branches function together as directional coupler.

Both preferably to be used types of switches can be switched within fractions of a nanosecond, thus an extreme short time for decoupling of the transmitter unit from the detection circuit can result. This is being achieved by the second waveguide respectively any other waveguides can be matched temporarily by its characteristic impedance, thus the waveguide obtains a finite attenuation and can be charged fast (surge-charged) with the excitation wave.

At another preferred embodiment at least one of the waveguides is arranged as coaxial transmission line.

Coaxial transmission lines comprising an inner cylindrical conductor and an outer cylindrical conducting sheath offer the advantage of an uniform and in comparison with the thickness of the sheath smaller skin depth compared with other shapes of waveguides. The electromagnetic fields propagate almost entirely within the intervening dielectric medium, thus avoiding the generation of stray fields. The outer surface of the outermost conducting sheath of the coaxial transmission line offers also a good shield against electromagnetic radiation from the environment.

Several coaxial waveguides can form also a multiple coaxial guide with a common axis. Such a guide exhibits besides a cylindrical central conductor two or more coaxial cylindrical conducting sheaths separated each by a dielectric medium, whereby the exterior surface of any sheath serves for an inner conductor for the inside of the next larger sheath. By this means can be assembled double, triple or multiple coaxial waveguides with a common axis each with a length of $n\cdot\lambda/4$ and each conducting high-frequency currents independent of each other.

By this means it is feasible to feed into the probe head in addition to the proton-frequency, very frequently needed in NMR experiments, other, preferably lower frequencies by a simple and compact assemblage. The introduction of an excitation wave of lower frequency from an outer coaxial guide into an inner coaxial guide occurs preferably at a null point of the impedance, providing simultaneously a voltage-node of the excitation wave in the inner coaxial line. At this voltage-node a high degree of isolation between the lower frequency channel and the higher frequency channel is being achieved.

Further other frequencies can be coupled into such a waveguide system via appropriate apertures and impedance matching.

The excitation of the sample with pulse sequences of different frequencies is necessary for the determination of contained substances and their structure. Thus the high frequency channel, often proton frequency, is used e.g. for cross polarization and dipolar decoupling, and the lower frequency channels are used for observation, dephasing or coherence transfer.

In this association it is also advantageous, if the first and the second waveguide form a multiple coaxial transmission line with a common axis. By this means it is possible to arrange the waveguides most space-economizing. This is particularly advantageous if as dielectric medium helium-II is being used, which circulates by the Fountain-effect through appropriate positioned semipermeable diaphragms and removes heat adequately. Also is being achieved by the compact assemblage of the waveguides, that the dimensions of the probe head can be kept as small as possible, so that the small space in a superconducting high field magnet is being optimal utilized.

In particular it is possible to achieve an attenuation constant of $\alpha \leq 10^{-8}$ Np/m if the coaxial designed waveguides are constructed of some material enabling power transmission at the anomalous skin effect. By this means such coaxial waveguides are almost lossless.

According to another embodiment of this invention a second antenna is provided for improving the signal-to-noise ratio furthermore substantially, whereby the antennas are arranged such that the first antenna detects the sample and the noise-signal within the equatorial near field of the sample while the second antenna detects only the noise signal within the axial near field of the sample.

A NMR-sample is best described by a Hertzian dipole, being irradiated by the excitation wave and radiating itself. This Hertzian dipole is arranged at the centre of the first antenna, which generates the high frequency $B_1$-field in the x-direction, whereby as well the $B_1$-field as also the Hertzian dipole are oriented in the same direction perpendicular to the z-direction, which is oriented along the longitudinal axis of the first antenna.

At the near field of a Hertzian dipole, is the energy/power radiated due to the excitation at its maximum in the equatorial plane whereas no energy/power is radiated into the axial direction. In opposition the thermal Nyquist-noise is radiated isotropically at all directions by the sample. This nearfield radiation pattern yields a possibility for receiving two independent signals simultaneously from one sample, by measuring at the near-field of the sample the energy/power being radiated at the equatorial plane as well as the one radiated at the axial direction.

The first antenna can be constructed at one preferred embodiment as resonator in the shape of a tube slitted lengthwise on both sides with a termination that can be short-circuited. Such an embodiment corresponds with the slitted, saddle-shaped, u.h.f-single-turn-Helmholtz-coils used at the present time in high-resolution NMR-experiments.

The reactive short-circuit can temporarily be transformed into a characteristic impedance by switching in an impedance for surge-charging and -discharging of the primary detection circuit with the excitation wave.

The antenna can be coupled to the first waveguide via a $\lambda/4$-transformation with frequency bandwidth compensation. By this means the impedance of the first waveguide will be matched almost lossless to the impedance of the antenna, thus perturbing reflection will be avoided.

The second antenna can be realized e.g. by a short electric or magnetic dipole-antenna oriented in the near-field of the sample in the direction of the $B_1$-field in particular with a Luneburg lens focussing.

Each of the different approaches—the utilization of the anomalous skin effect, the switchable coupling of the excitation wave in connection with the isolation of the transmitter unit from the preamplifier unit, the utilization of helium-II as cryogen as well as dielectric as well as the utilization of the near-field characteristic of the radiating sample are qualified to improve significantly the signal-to-noise ratio.

Nevertheless it is to be established, that the object determined at the beginning is achieved optimal by the utilization of all the different approaches combined. Thus improvements in the signal-to-noise ratio can be achieved at NMR-experiments at samples radiating extreme weak signals by a factor far in excess of 50 in comparison with today's at room temperature operating probe heads.

In the following the invention will be illustrated by figures of preferred embodiments.

Figure 1:
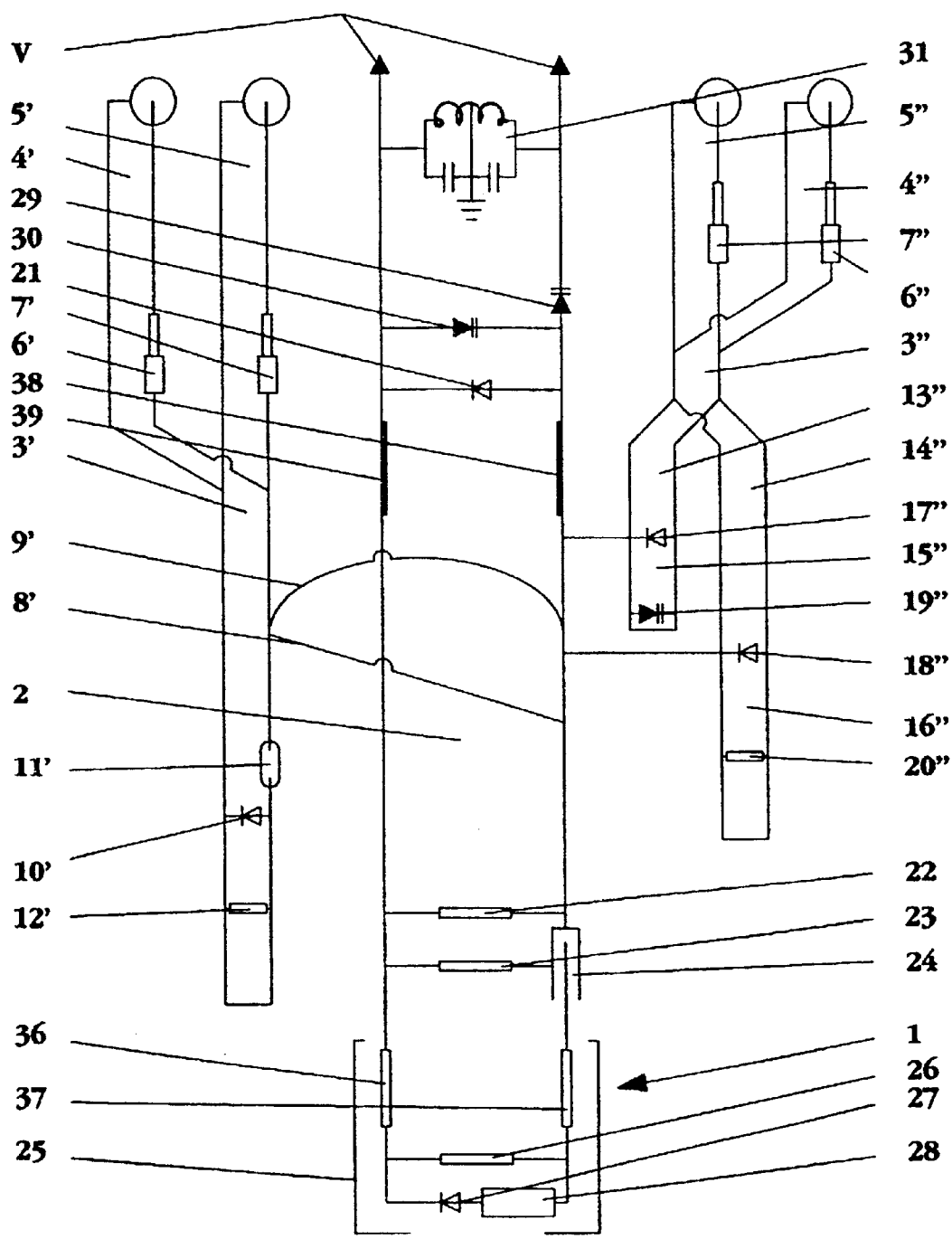
FIG. 1 shows a circuit diagram of a preferred embodiment of this invention

In FIG. 1 is shown a circuit diagram of possible embodiments of the probe head in accordance with this invention.

The probe head comprises a first antenna 1, being connected via the end characterized by arrows V of a first waveguide 2 with a preamplifier unit, which is not depicted.

The first antenna 1 is in addition connected with two transmitter units. Two different arrangements are described at the circuit diagram for coupling the first antenna 1 to the transmitter unit, whereby reference numbers characterized with the mark ' are correlated with one of the arrangements while those characterized with the mark " are correlated with the other arrangement.

Both of these arrangements differentiate each other by the method of their coupling into the first waveguide 2.

At both arrangements the coupling of the excitation wave into the first waveguide 2 via a second waveguides 3' resp. 3", to which the excitation waves of the transmitter units from a third waveguide 4' resp. 4" and from a fourth waveguide 5' resp. 5" in each case couple to at a voltage-node (impedance minimum) of the second waveguide 3' resp. 3". Thus e.g. pulse sequences with an u.h.f.-frequency can be transmitted via the third waveguide 4' resp. 4", while some pulse sequences of lower (h.f.)-frequencies via the fourth waveguide 5' resp. 5".

The impedance matching of the third waveguide 4' resp. 4" and of the fourth one 5' resp. 5" with the second waveguide 3' resp. 3" is caused by $\lambda/10$-transformers 6', 6", 7' and 7" as described e.g. at Meinke/Gundlach, Taschenbuch der Hochfrequenztechnik, 5. ed., Vol. 2, pg. L3 f.

All of there waveguides are executed as coaxial transmission lines/waveguides with two current carrying conducting surfaces, precisely as all the other described waveguides.

The arrangements differ in the means of coupling the excitation waves from the second waveguide 3', 3" to the first waveguide 2.

At the arrangement depicted on the left side of FIG. 1 the excitation wave of the transmitter units is coupled from the second waveguide 3' into a wave-divider, which bisects the excitation wave into two partial waves. The wave-divider comprises a first guide 8' and a second guide 9', whereby the second one 9' is designed as $\lambda/2$-detour and both guides 8', 9' couple into the first waveguide 2 at a distance of $\lambda/4$ in between. Within the wave-divider the phase of one of the partial wave is shifted by $\lambda/2$ in direction towards the preamplifier unit V in reference to the second one, thus the standing wave generated within the first waveguide 2 cancel in the direction of the preamplifier unit. Thus this arrangement functions like a directional coupler, letting the excitation wave only pass into the direction of the antenna 1.

The coupling of the excitation wave into the waveguide is switchable. The second waveguide 3' is equipped for this means with a discharge gap 11' $\lambda/2$ distant from the area of coupling into the waveguide, which depending on its construction can be short-circuited via a helium plasma- or arc discharge. The discharge gap is dimensioned such, that the second waveguide 3' obtains at non-short-circuited conditions the characteristic of an open-circuited line (resonator). This generates a standing wave in the second waveguide 3', which generates in the area of the aperture for coupling into a connecting waveguide a voltage-anti-node, and thus forestalls the coupling of that wave into that waveguide. The discharge at the discharge gap 11' is ignited by the high-frequency excitation wave itself or also as in case of the helium plasma discharge—by means of a laser pulse.

The second waveguide 3' is short-circuited by a pin-diode 10' immediately behind the discharge gap during the excitation of the sample by the excitation wave.

The pin-diode 10' will be switched on only temporarily at the beginning and at the end of the excitation of the sample, whereby the waveguide 3' is being matched by a foil of its characteristic impedance 12', which is arranged at a distance of λ/4 past the pin-diode 10'. By this means the second waveguide 3' obtains the characteristic of an infinite waveguide, thus charging with the excitation wave can occur extremely fast—in the order of fractions of nanoseconds.

Simultaneously the reflected wave at the anterior surface of the impedance-foil 12' will be annihilated by the wave reflected from the λ/4 distant short-circuited termination of that waveguide.

The discharge gap 11' has to be short-circuited for excitation of the sample. By this means the second waveguide 3' is being short-circuited λ/2 distant from the area of coupling into the wave divider, thus the standing wave being generated in the second waveguide 3' is producing a voltage-node in the area of coupling the signal into the wave divider and consequently is able to couple into the wave divider.

On termination of the discharge the standing wave of the excitation wave is displaced on account of the reflection of the excitation wave at the now open-circuited second waveguide 3' by a λ/4, therefore in the area of the coupling there exists now a voltage-anti-node and thus the excitation wave can not couple into the waveguide.

At the arrangement displayed at the right side of FIG. 1 the excitation wave is coupled from the second waveguide 3" to a wave divider with a first guide 13" and a second guide 14", by this means the excitation wave is bisected into two partial waves. Both partial waves are coupled into the first waveguide 2 λ/4 distant from each other, whereby the phase of one of the partial waves being coupled into the first waveguide 2 in reference to the other partial wave being coupled into the first waveguide 2 acquires in the direction towards the preamplifier unit a phase difference of λ/2, thus the standing wave being generated in the first waveguide 2 in the direction towards the preamplifier unit annihilates itself by destructive interference. For this, both of the guides 13", 14" have in the area of the apertures, provided for coupling of both of the partial waves into the waveguide 2, pin-diodes 17", 18", for forcing the generation of voltage-nodes in the area of the apertures within the partial waves.

Also this arrangement performs therefore as directional coupler, permitting passage of the excitation wave only in the direction towards the antenna.

The waveguide 13" terminates past the aperture for coupling in a short-circuited λ/4-line 15", in which a varactor 19" is arranged for the precise tuning of the voltage-node for coupling and dividing of the excitation wave. The waveguide 14" terminates past the aperture for coupling to a short-circuited λ/2-line 16", which has arranged in its middle a characteristic impedance in shape of a foil 20" for temporarily matching of the waveguide 3" during surge-charging and -discharging it with the excitation wave.

If the guides 13", 14" are not short-circuited by the pindiodes 17", 18", then the voltage-nodes of the standing partial wave are displaced by λ/4 towards the short-circuited termination. By this means there exist in the area of the coupling of the partial wave a voltage-antinode, such that the partial waves are not able to couple into the first waveguide 2.

Via the varactor 19" the phase of both of the partial standing waves can be precisely tuned, being generated by the excitation wave in both of the guides 13", 14". The via the pin-diode 18" temporarily additionally switchable characteristic impedance 20" serves in the above explained means for fast surge-charging and -discharging of the waveguides with the excitation wave.

An additional decoupling of the preamplifier unit V from the excitation wave can be caused by short-circuiting temporarily the first waveguide 2 with the pin-diode 21 arranged above the area of coupling the excitation wave to the first waveguide 2. The pin-diode 21 is arranged in the first waveguide 2 such that in this area a voltage-node of the standing wave is being generated.

The apertures for coupling partial waves into the first waveguide 2 are preferably executed as well-proportioned circumferential slots.

To prevent unwanted reciprocal interactions between the different excitation waves at the diverse transmitter units as well as at the preamplifier unit V their outputs respectively their inputs have to be protected by appropriate traps or band-stop filters in coaxial transmission line design.

The antenna 1 is arranged at the lower end of the first waveguide 2. Its impedance is matched to the first waveguide 2 by a λ/4-transformation with frequency band-width compensation 22, 23, 24 in the manner described in Meinke/Gundlach (see location mentioned above)

The first antenna 1 is designed as resonator. It comprises an inductively coupled shield 25. The reactive termination resistance 26 effects, that within the first antenna 1 a standing wave is generated with a voltage node exactly at the position of the sample, whereby the dielectric coupling of the sample is very much reduced. In addition an impedance 28 is arranged to be temporarily switched in addition by a pin-diode 27, thus generating a characteristic termination impedance. In one respect the first waveguide 2 can be surge-charged by this arrangement within the shortest time by the excitation wave. On the other hand can by this means any remainder of energy in the antenna of the excitation wave be dissipated within the shortest possible time, as soon as the measurement/signal transmission is to start.

In an analogous manner operates alternatively as a very fast switchable supplementary characteristic termination impedance for the primary detection circuit a non-inductive surface sheath 38, 39 of a hard type II superconductor, e.g. NbN or $Nb_3Sn$, of about the thickness of the Ginzburg-Landau coherence length on a sapphire substrate with the magnetic field $B_0$ oriented parallel to the film, which can be inserted in the superconducting state without any problems into the practically perfect conducting surface of the first waveguide 2. By means of a semiconductor-laser this sheath of appropriate dimensions can be transformed within nanoseconds into the normal conducting state having the properties of a characteristic impedance.

The antenna can be tuned to resonance and matched via variable capacitors (varactors) 29, 30 and a symmetrizing pot 31 to the preamplifier unit V, all arranged within the first waveguide 2 to be taken care within an inductive area of the first waveguide 2.

Figure 2:
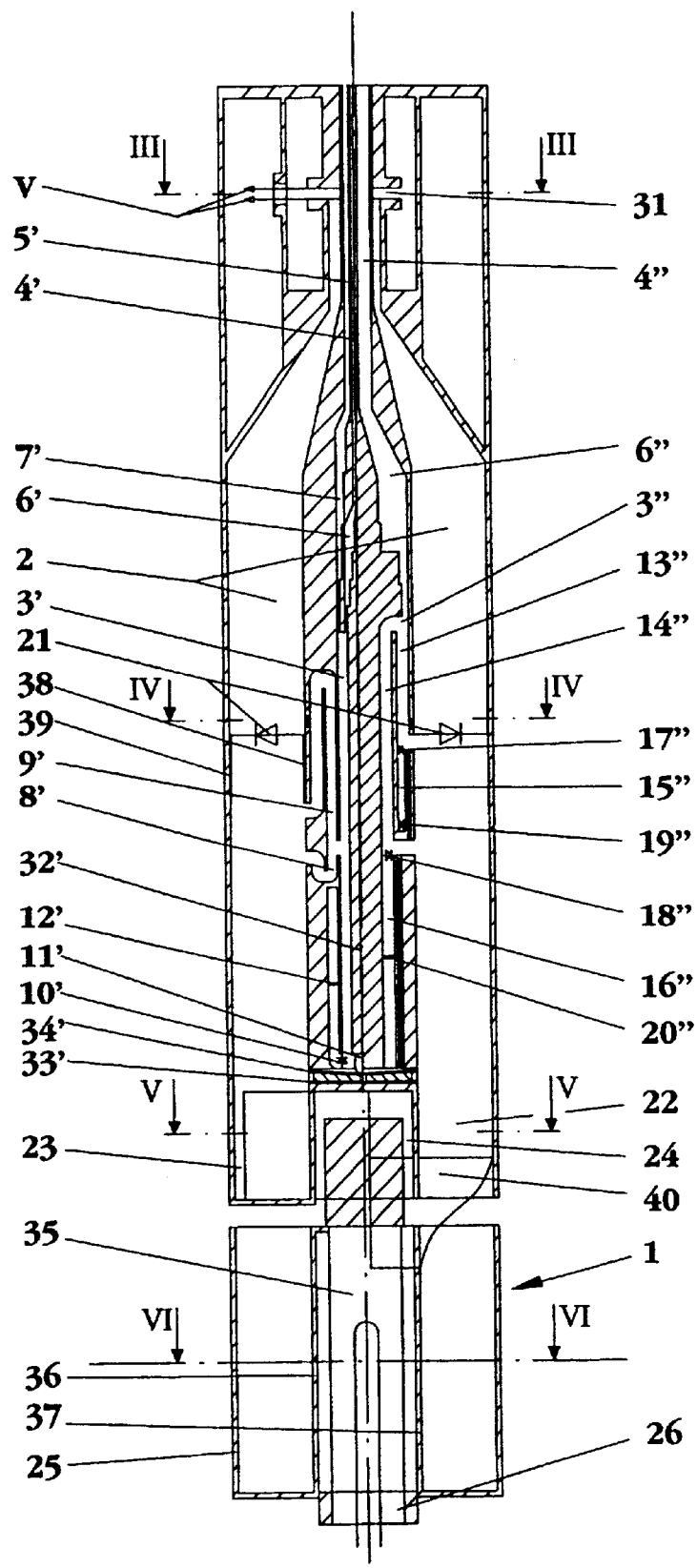
FIG. 2 shows a longitudinal section of some possible preferred embodiments of this invention
Figure 3:
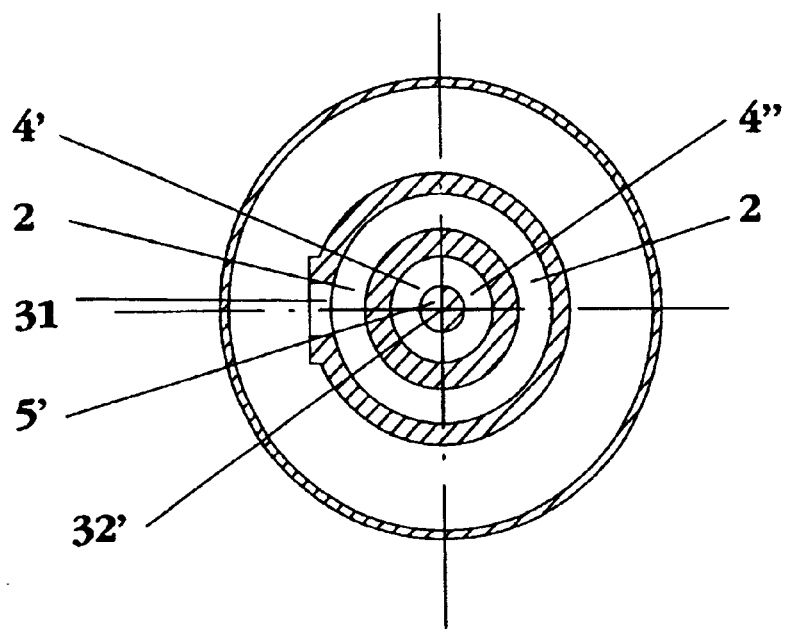
FIG. 3 shows a cross-section of these embodiments along line III—III in FIG. 2
Figure 4:
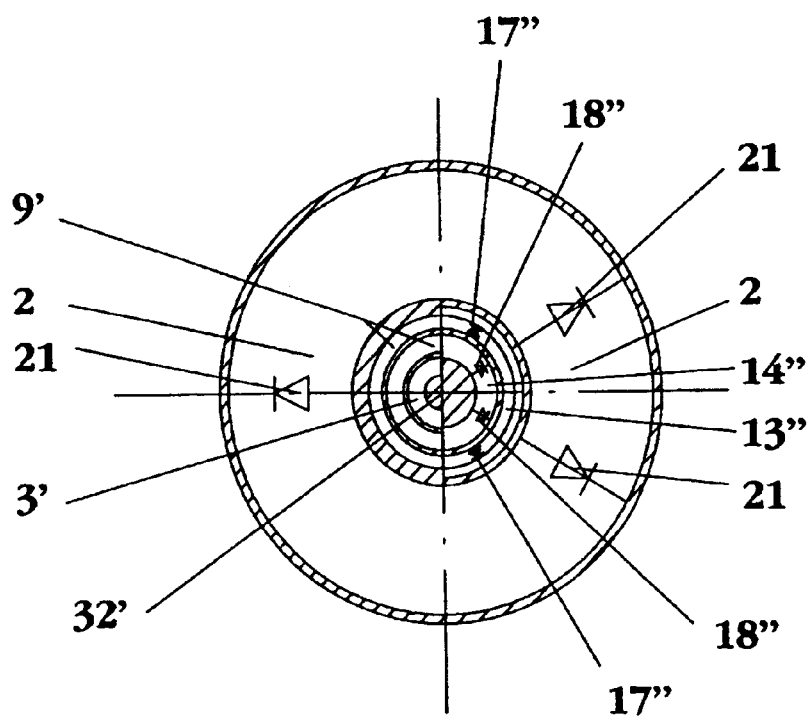
FIG. 4 shows a cross-section of these embodiments along line IV—IV in FIG. 2
Figure 5:
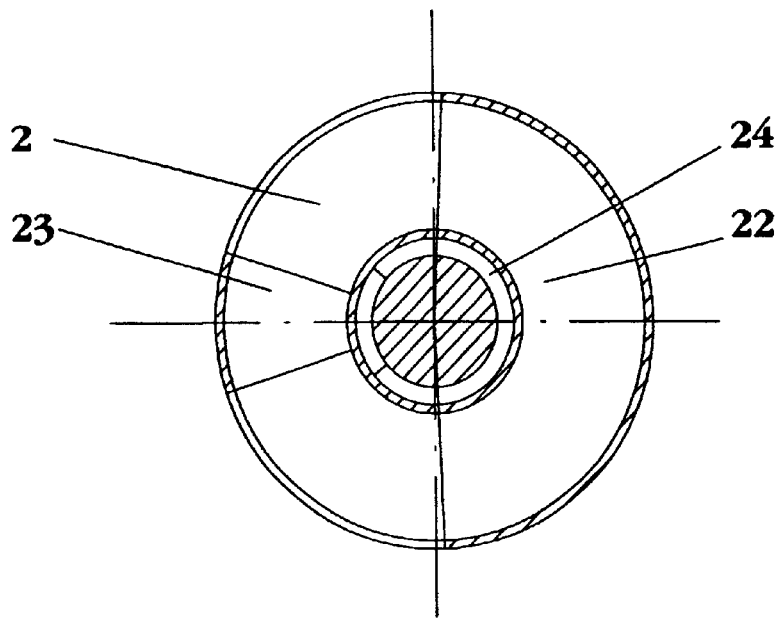
FIG. 5 shows a cross-section of these embodiments along line V—V in FIG. 2
Figure 6:
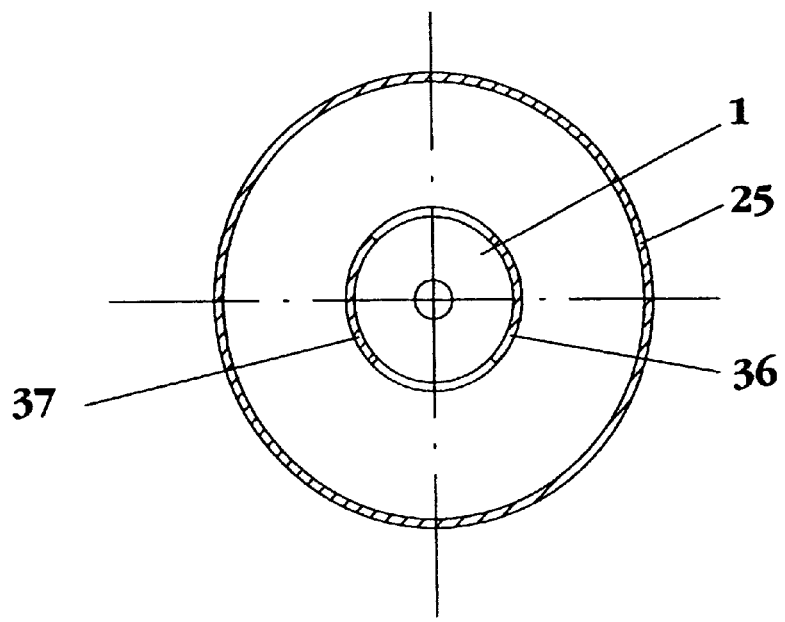
FIG. 6 shows a cross-section of these embodiments along line VI—VI in FIG. 2

FIG. 2 demonstrates an embodiment of the probe head in accordance with FIG. 1. Moreover the representation to the left of the longitudinal axis corresponds with the left part of FIG. 1 and the one to the right of the longitudinal axis depicts essentially the right side of FIG. 1.

As in particular the transverse sections of this embodiment in FIGS. 3, 4, 5 and 6 demonstrate, all the waveguides 2, 3', 3", 4', 4", 5', 5", 6', 6", 7', 7", 8', 9', 13", 14", 15" and 16" are designed as multiple coaxial transmission lines with a common axis. All these coaxial transmission lines are being filled completely with helium-II, serving its dual-function as dielectric and cryogen.

At the embodiment depicted at the left side the innermost conductor of the multicoaxial waveguide is constructed as a hollow cylinder being closed off by the helium plasma container fabricated of quartz or sapphire, thus forming the discharge gap. 11'. The helium plasma discharge is being controlled by a laser beam guided by dielectric waveguide 32' through that hollow cylinder.

A channel passes through one electrode of the discharge gap 11' having an inlet 33' and an outlet 34' for helium-II from and back to the first waveguide 2 for removal of the heat of dissipation of the helium plasma discharge. The outlet 34' is closed off by a semipermeable diaphragm, e.g. prepared of $Al_2O_3$-powders, not depicted at FIG. 2, thus the heat exchange takes place by the fountain effect in helium-II. By this means a helium-II circulation through the probe head is ensured, whereby the helium-II delivers the heat of dissipation to the cryostat.

At another not depicted embodiment the second waveguide 3', 3' can be used for discharging by the fountain effect as it is connected anyhow with the cryostat, substituting for the discharge developed from that channel.

All waveguide components of this probe head are precisely matched and connected with each other for avoiding reflections of electromagnetic waves. All pin-diodes 10', 17", 18", 21 and 27 are also one-sided insulated by an appropriate capacitor, in order to be controlled by a direct current of a few milliamperes, without being perturbed by the high frequency waves.

As potential useful pin-diodes are to be mentioned among other those of gallium-arsenide (GaAs).

Figure 7:
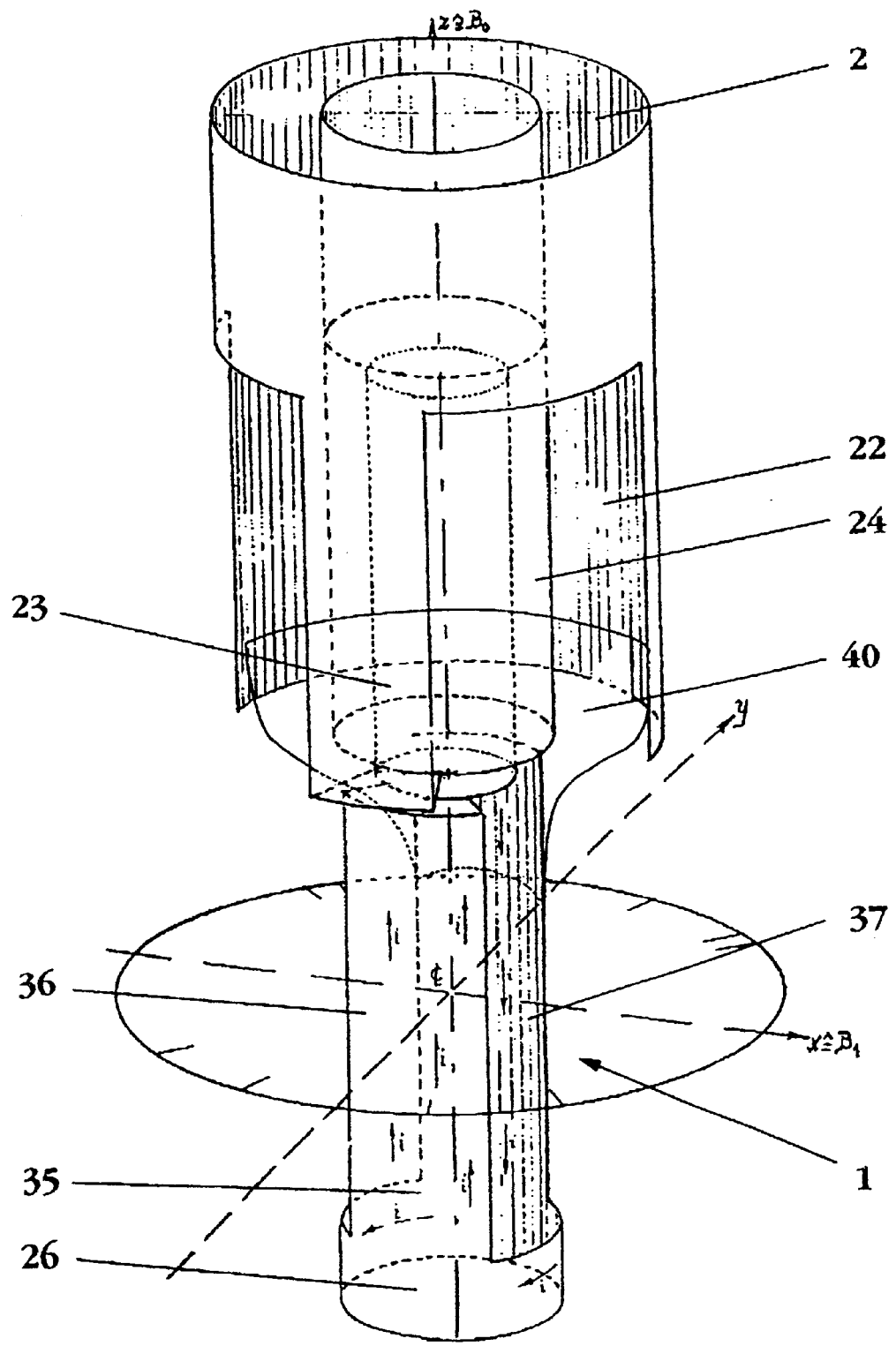
FIG. 7 shows an isometric projection, parallel-perspective of an antenna of a preferred embodiment including its $\lambda/4$-coupling onto the first waveguide.

The antenna 1 is depicted in FIG. 7 in an isometric projection. It consists of a tube 35 slitted lengthwise on both sides nearly to its lower end, whereby each slit extends respectively circumferentially to ca. 100°. The slitted tube 35 is terminated with a susceptance (cf. Meinke/Gundlach, Taschenbuch der Hochfrequenztechnik, $5^{th}$ ed., vol. 1, C21)

One of the axial extending vanes 36, 37 formed by the slits is connected via a lossless Dolph-Tchebycheff line transition 40, shown in particular in FIG. 2, to the internal conducting surface of the outer coaxial sheath of the first waveguide 2. The other vane 36 is connected in series via a concentrically to the axis of the tube extending, cylindrical tubular conductor which extends in direction to the first waveguide 2. The tubular conductor is a $\lambda/4$-transformation line 24 being open at its upper end. The outer side of the tubular conductor serves as inner conductor of the $\lambda/4$-transformation line 23. The $\lambda/4$-transformation line 23 is short-circuited at its lower end and connected to the first waveguide at its upper end.

While the Dolph-Tchebycheff line transition 40 extends circumferentially about 177° the $\lambda/4$-transformation line 24 extends circumferentially about 35° both lines being arranged on opposite sides.

Both the connection line, which connects vane 36 with the inner conductor of the $\lambda/4$-transformation line 24, and the connection line short circuiting the end of the $\lambda/4$-transformation line 24 are preferably designed as Dolph-Tchebycheff lines.

In the described embodiment a standing electromagnetic wave field is generated between the opposite standing vanes perpendicular to the axis of the cylinder, whereby in its centre, at which the sample is positioned, a voltage-node and thus a high frequency magnetic field exists, which is very homogeneous. The antenna 1 acts like a slitted single-turn-Helmholtz-coil analogous to the ones used at present in high-resolution NMR-spectrometers.

In an analogous way antennas may be adapted to the first waveguide for one or more frequencies or "magic angle spinning" and "cross polarization" or "decoupling" experiments with or without gradient fields.

The sample is introduced from below into the vertical central bore of the superconducting high field magnet. It is separated by a dewar from the cryogenic cooled elements of the antenna, therefore the sample can be investigated at room-temperature, or any other independent temperature.

In the preferred probe head a cryogenic cooled preamplifier unit V is being used, in order to avoid also in this area a reduction of the signal-to-noise ratio. As suitable preamplifier unit can in particular be used the one described by R. J. Prance et al. in Journal of Physics E: Scientific Instruments, vol. 15, pg. 101–104, 01. 1982: "U.H.F. ultra low noise cryogenic FET preamplifier".

The complete probe head including the antenna 1 is being enclosed by a in the drawing nondepicted cryostat with cryogenerator for closed-circuit operation at 1.85 K, to be introduced from above into the vertical central bore of the superconducting high field magnet, whereby in that bore room-temperature prevails. The space for the sample is executed as an upward directed re-entrant cavity into the cryostat.

What is claimed is:

1. Probe head for a NMR-spectrometer comprising at least one transmitter unit for generating electromagnetic excitation waves of high frequencies and at least one preamplifier unit (V) for amplification of signals emanating from a sample which has been excited by means of the excitation waves, with a cryogenically cooled primary detection circuit including at least a first antenna (1) and a first waveguide (2), whereby said first antenna (1) is connected to said preamplifier unit (V) via said first waveguide (2), characterized in that at least said first waveguide (2) operates in the range of the anomalous skin effect, whereby the mean free path of the charge carriers at least in said first waveguide (2) being larger than the electromagnetic skin-depth, and whereby said primary detection circuit is provided with means for temporarily matching it with its own characteristic impedance.

2. Probe head according to claim 1, characterized in that at least said first waveguide (2) operates in the range of the extreme anomalous skin effect.

3. Probe head according to claim 1 or 2, characterized in that at least said first waveguide (2) is produced of a metal having a preferably high inherent resistivity ratio $r_i > \approx 10^4$.

4. Probe head according to claim 3, characterized in that at least for said first waveguide (2) aluminum of highest purity is being used as conductor material.

5. Probe head according to claim 3, characterized in that at least the interior and exterior conductor surfaces of said first waveguide (2) possess the same inherent conductivity as the interior of the conductor.

6. Probe head according to claim 1, characterized in that said preamplifier unit (V) and said first antenna (1) are switchably interconnected.

7. Probe head according to claim 1, characterized in that helium-II is used as cryogen.

8. Probe head according to claim 7, characterized in that the operating temperature is at about 1.85 K.

9. Probe head according to claim 7 or 8, characterized in that said helium-II is used at least within said first waveguide (2) as dielectric medium.

10. Probe head according to claim 9, characterized in that said first antenna (1) is arranged within the NMR-spectrometer below said first waveguide (2).

11. Probe head for a NMR-spectrometer comprising at least one transmitter unit for generating electromagnetic excitation waves of high frequencies and at least one preamplifier unit (V) for amplification of signals emanating from a sample which has been excited by means of the excitation waves, with a cryogenically cooled primary detection circuit including at least a first antenna (1) and a first waveguide (2), whereby said first antenna (1) is connected to said preamplifier unit (V) via said first waveguide (2), characterized in that a second wave guide (3', 3") is coupled in particular via at least one aperture to said first waveguide (2), that said second waveguide (3', 3") is connected with said transmitter unit, and means are provided for coupling the excitation wave from said second waveguide (3', 3") to said first wave guide (2), by which means the propagation of the excitation wave is suppressed in direction to said preamplifier unit.

12. Probe head according to claim 11, characterized in that said means for coupling the excitation wave comprise a $\lambda/2$-detour line (9') and operating like a directional coupler.

13. Probe head according to claim 11, characterized in that, that said means for coupling the excitation wave comprise within said first waveguide (2) between the area of the coupling of said second waveguide (3', 3") to said first waveguide (2) and said preamplifier unit means for short-circuiting, in particular at least one pin-diode (21).

14. Probe head according to claim 11, characterized in that the coupling of the excitation wave from said second waveguide (3', 3") to said first waveguide (2) is switchable.

15. Probe head according to claim 14, characterized in that said second waveguide (3') is arranged in form of an open-circuited waveguide resonator, which can be short circuited temporarily via a discharge gap (11') in a distance of $n \cdot \lambda/2$ from said aperture for coupling to said first waveguide (2) in the direction opposite to the transmitter unit.

16. Probe head according to claim 15, characterized in that at least one of the electrodes of said discharge gap (11') is refrigerated by helium-II, whereby said electrode is equipped with a channel having at least one inlet (33') and one outlet (34') for helium-II, and whereby said outlet (34') is equipped with a semipermeable diaphragm.

17. Probe head according to claim 14, characterized in that said second waveguide (3") branches into two conducting paths (13", 14"), which couple preferably at a distance of $(2n+1) \cdot \lambda/4$ to said first waveguide (2), whereby each of the two conducting paths (13", 14") end in a termination which can be shortened by $(2n+1) \cdot \lambda/4$ by a switchable short circuit.

18. Probe head according to claim 17, characterized in that both conducting paths (13", 14") have at their ends short-circuited guides (15", 16") each with a length of $(2n+1) \cdot \lambda/4$ whose entrance in particular can be short-circuited by at least one pin-diode (17", 18").

19. Probe head according to claim 11, characterized in that at least one of said waveguides is designed as a coaxial transmission line.

20. Probe head according to claim 19, characterized in that several coaxial transmission lines form one multiple coaxial transmission line with one common axis.

21. Probe head according to claim 11, characterized in that at least said first waveguide (2) operates in the range of the anomalous skin effect, whereby the mean free path of the charge carriers at least in said first waveguide (2) being larger than the electromagnetic skin-depth, and whereby said primary detection circuit is provided with means for temporarily matching it with its own characteristic impedance.

22. Probe head for a NMR-spectrometer comprising at least one transmitter unit for generating electromagnetic excitation waves of high frequencies and at least one preamplifier unit (V) for amplification of signals emanating from a sample which has been excited by means of the excitation waves, with a cryogenically cooled primary detection circuit including at least a first antenna (1) and a first waveguide (2), whereby said first antenna (1) is connected to said preamplifier unit (V) via said first waveguide (2), characterized in that a second antenna is provided, whereby said antennas are arranged such, that said first antenna (1) receives the NMR signal and the noise of said sample in the equatorial near-field of the like a Hertzian dipole radiating said sample and said second antenna receives only the noise of said sample in the axial near-field of said sample.

23. Probe head according to claim 22, characterized in that said first antenna (1) is designed as a resonator in the shape of a tube (35) slitted lengthwise on both sides with a termination that can be short-circuited.

24. Probe head according to claim 22, characterized in that said first antenna (1) is coupled via a $\lambda/4$-transformation (22, 23, 24) with frequency bandwidth compensation into said first wave guide (2).

25. Probe head according to claim 22, characterized in that said second antenna is realized by an elementary short electric or magnetic dipole antenna oriented within the near-field of the sample axial in the direction of the $B_0$-field in particular with a Luneburg-lens.

26. Probe head according to claim 22, characterized in that at least said first waveguide (2) operates in the range of the anomalous skin effect, whereby the mean free path of the charge carriers at least in said first waveguide (2) being larger than the electromagnetic skin-depth, and whereby said primary detection circuit is provided with means for temporarily matching it with its own characteristic impedance.

27. Use of helium-II in a probe head for a NMR-spectrometer comprising at least one transmitter unit for generating electromagnetic excitation waves of high frequencies and at least one preamplifier unit (V) for amplification of signals emanating from a sample which has been excited by means of the excitation waves, with a cryogenically cooled primary detection circuit including at least a first antenna (1) and a first waveguide (2), whereby said first antenna (1) is connected to said preamplifier unit (V) via said first wave guide (2).

* * * * *